(12) United States Patent
Jeong

(10) Patent No.: US 7,732,304 B2
(45) Date of Patent: Jun. 8, 2010

(54) METHOD OF MANUFACTURING SEMICONDUCTOR DEVICE

(75) Inventor: Young-Seok Jeong, Gijang-gun (KR)

(73) Assignee: Dongbu HiTek Co., Ltd., Seoul (KR)

( * ) Notice: Subject to any disclaimer, the term of this patent is extended or adjusted under 35 U.S.C. 154(b) by 30 days.

(21) Appl. No.: 12/145,319

(22) Filed: Jun. 24, 2008

(65) Prior Publication Data

US 2008/0318414 A1 Dec. 25, 2008

(30) Foreign Application Priority Data

Jun. 25, 2007 (KR) .................. 10-2007-0062082

(51) Int. Cl.
*H01L 21/322* (2006.01)
(52) U.S. Cl. .................. 438/474; 438/680; 438/687; 257/E21.17; 257/E21.23; 257/E21.249; 257/E21.267; 257/E21.319; 257/E21.304; 257/E21.585
(58) Field of Classification Search .................. 438/474, 438/680, 700, 687, 740, 769; 257/E21.17, 257/23, 249, 267, 319, 304, 585
See application file for complete search history.

(56) References Cited

U.S. PATENT DOCUMENTS

| 5,741,626 | A | * | 4/1998 | Jain et al. ................ 430/314 |
| 6,107,177 | A | * | 8/2000 | Lu et al. .................. 438/597 |
| 6,350,675 | B1 | * | 2/2002 | Chooi et al. ............. 438/624 |
| 6,506,680 | B1 | * | 1/2003 | Kim et al. ................ 438/692 |
| 7,341,948 | B2 | * | 3/2008 | Ponoth et al. ........... 438/687 |

FOREIGN PATENT DOCUMENTS

| KR | 10-2001-0045454 | 6/2001 |
| KR | 10-2004-0056030 | 6/2004 |

* cited by examiner

*Primary Examiner*—David Nhu
(74) *Attorney, Agent, or Firm*—Sherr & Vaughn, PLLC

(57) ABSTRACT

A method of manufacturing a semiconductor device according to embodiments includes forming an interlayer dielectric film with a damascene pattern over a semiconductor substrate having a lower metal wire. A seed layer may be formed over the interlayer dielectric film including the damascene pattern. Impurities generated during the formation of the seed layer be removed through an annealing process using $H_2$. A copper wire may then be formed by filling the damascene pattern.

20 Claims, 4 Drawing Sheets

METHOD OF MANUFACTURING SEMICONDUCTOR DEVICE

The present application claims priority under 35 U.S.C. 119 to Korean Patent Application No. 10-2007-0062082 (filed on Jun. 25, 2007), which is hereby incorporated by reference in its entirety.

BACKGROUND

As semiconductor integrated circuits evolve towards higher speed and greater integration, metal wires have recently been made with finer multilayer structure. Copper and low k (dielectric constant) materials have been introduced to reduce RC signal delay.

Metal patterning in accordance with size reductions within design rules creates difficulties in the manufacturing processes. A dual damascene process for forming wires has been developed which removes a metal etching step and an insulator gap charging step.

In the dual damascene process, a dual damascene pattern is formed over an interlayer dielectric film, allowing conductive material to be buried in a dual damascene pattern, thereby simultaneously forming a contact plug and a metal wire. To form a seed layer of the metal wire, an atomic layer deposition (ALD) process has been used. The ALD process is capable of forming a thin film having excellent step coverage and relatively uniform composition at relatively low temperatures. However, when forming the seed layer in the ALD process, the undesirable by-products carbon (C) and chlorine (Cl) may be produced. Also, when burying the metal wire in an electro chemical plating (ECP) process, voids may be generated, causing deterioration of the electrical properties of the device and device failure.

SUMMARY

A method of manufacturing a semiconductor device according to embodiments includes forming an interlayer dielectric film with a damascene pattern over a semiconductor substrate having a lower metal wire. A seed layer may be formed over the interlayer dielectric film including the damascene pattern. Impurities generated during the formation of the seed layer be removed through an annealing process using $H_2$. A copper wire may then be formed by filling the damascene pattern.

Before forming the seed layer, a barrier metal may be formed over the interlayer dielectric film including the damascene pattern. The annealing process may use $H_2$ at a flow rate of approximately 50 to 2000 sccm and proceed at a temperature of about 100 to 450° C.

DRAWINGS

Example FIGS. 1 to 8 are cross-sectional views showing a method of manufacturing a semiconductor device.

DESCRIPTION

Figure 1:
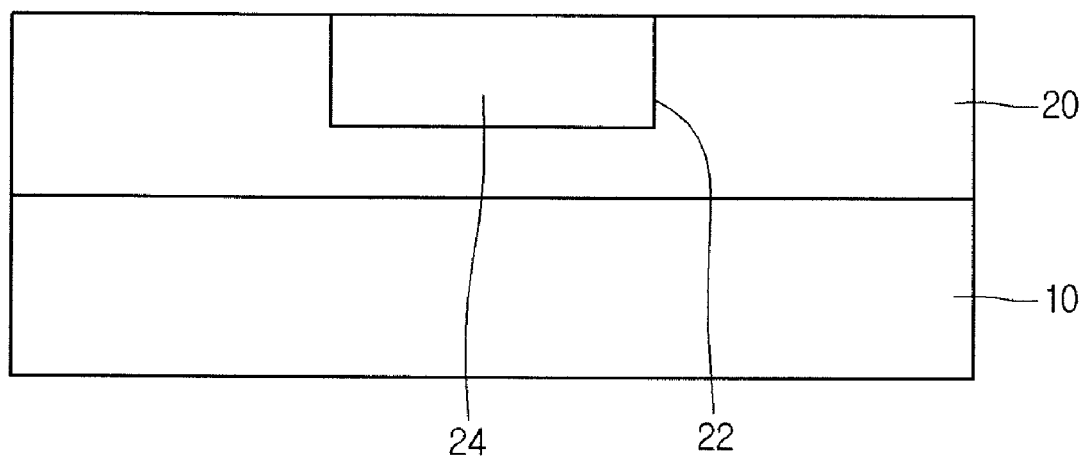

As shown in example FIG. 1, a first dielectric film 20 with a first trench 22 is formed over an upper surface of a semiconductor substrate 10. The first dielectric layer 20 may be, for example, selectively formed of fluorine doped silicate glass (FSG), undoped silicate glass (USG), and SiOC-based oxide film or SiOF-based oxide film. A lower metal wire 24 is formed by filling the first trench 22 with a conductive material. After depositing a copper layer over the first trench 22 and the first dielectric film 20, a planarization process is performed to form the lower metal wire 24.

Figure 2:
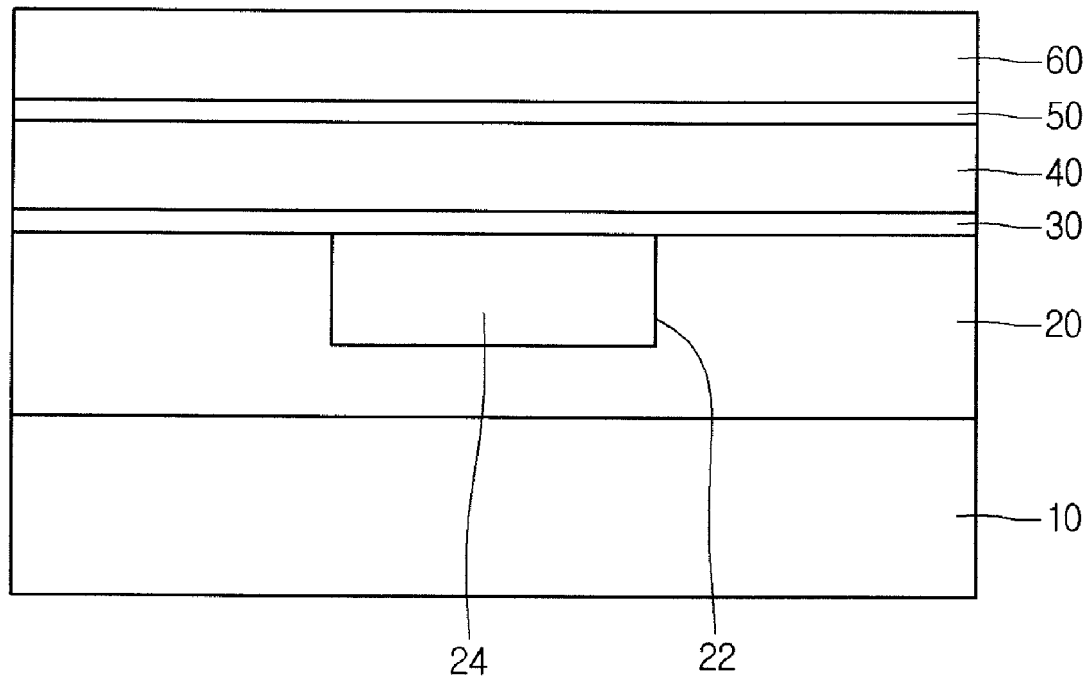

As shown in example FIG. 2, a first etch stop film 30, a second dielectric film 40, a second etch stop film 50, and a third dielectric film 60 are sequentially formed over the first dielectric film 20 formed with the lower metal wire 24. The first etch stop film 30 and the second etch stop film 50 may be formed, for example, of silicon nitride. The second dielectric film 30 and the third dielectric film 60 may, for example, be selectively formed of FSG, USG, SiOC-based oxide film, or SiOF-based oxide film.

Figure 3:
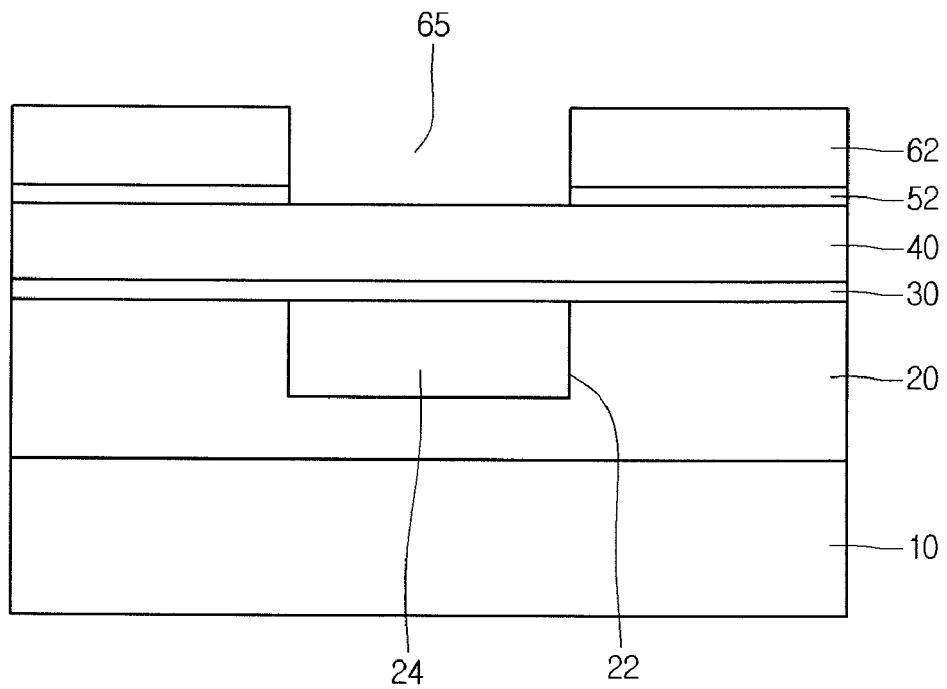

As shown in example FIG. 3, after forming a photoresist pattern over the third dielectric film 60, the third dielectric film 60 and the second etch stop film 50 are etched to form a second trench 65. After etching the third dielectric layer 60 using the second etch stop film 50 as an etch endpoint, the second etch stop film 50 is etched to form a second etch stop pattern 52 and a third dielectric pattern 62, thereby forming the second trench 65.

Figure 4:
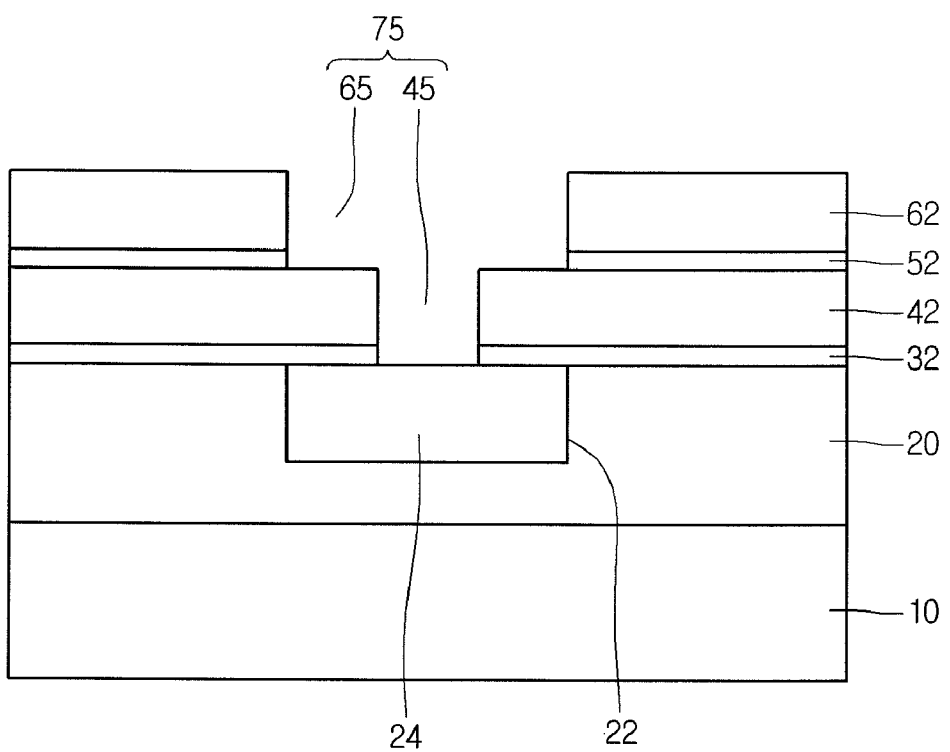

As shown in example FIG. 4, after forming a photoresist pattern over the second dielectric film 40, the second dielectric film 40 and the first etch stop film 30 may be etched, thereby forming a via exposing the lower metal wire 24. By forming the via 45, a damascene pattern 75 is completed. After etching the second dielectric film 40 using the first etch stop film 30 as an etch endpoint, the first etch stop film 30 may be etched to form a first etch stop pattern 32 and a second dielectric film pattern 42, thereby forming the via 45.

Figure 5:
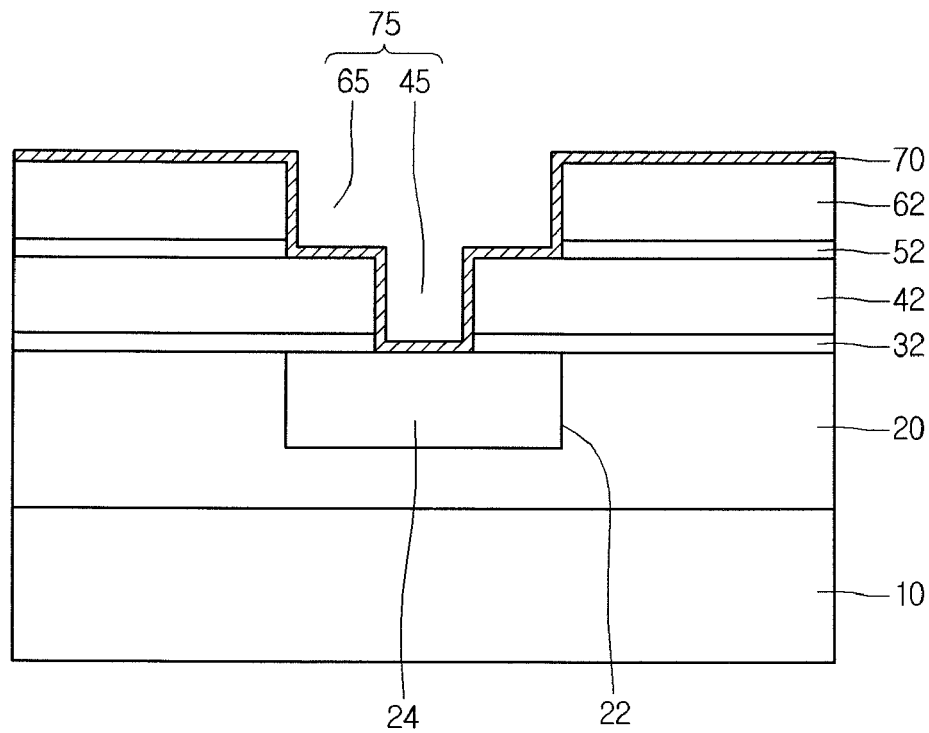

As shown in example FIG. 5, a barrier metal 70 may be formed over the semiconductor substrate 10 including the damascene pattern 75. The barrier metal 70 may be formed of, for example, Ta or TaN, through a chemical vapor deposition (CVD) process, an ALD, or a physical vapor deposition (PVD) process.

Figure 6:
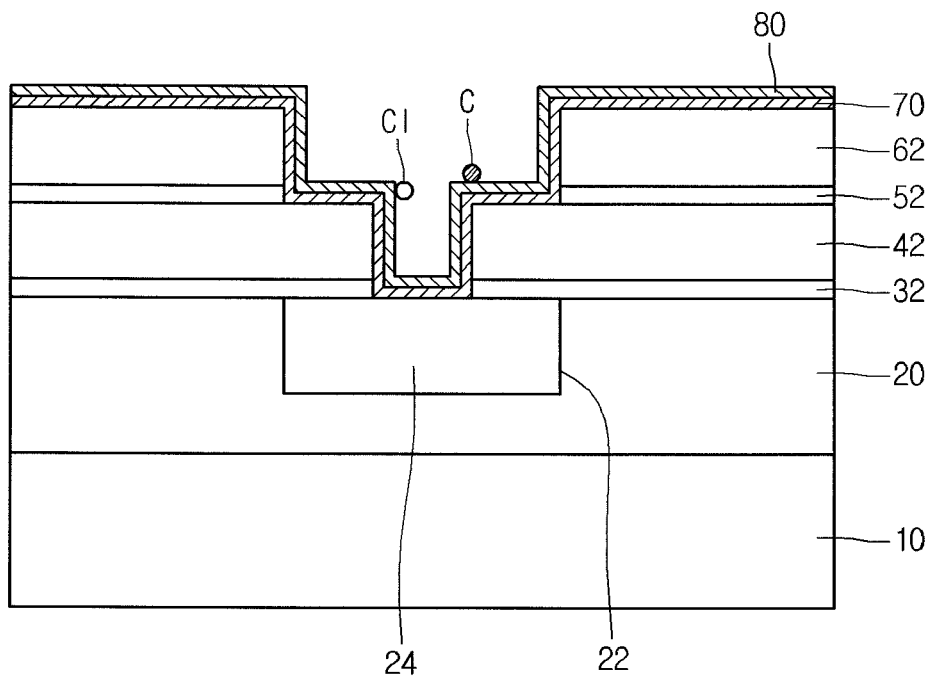

As shown in example FIG. 6, a copper seed layer 80 may be formed over the barrier metal 70. The copper seed layer 80 is formed at a thickness of 100 to 1000 Å using a metal organic source using, for example the ALD, CVD, PVD, or etc. processes. When forming the copper seed layer 80 with the ALD, CVD, PVD, or etc. processes, Cl (chlorine) ions or C (carbon) ions may be generated due to the source used. The Cl and C ions generated at this time remain on the copper seed layer 80, causing corrosion.

Due to the Cl ions and C ions remaining on the surface, the resistivity of the Cu seed layer becomes larger than pure Cu (copper). When performing a subsequent ECP process, growth of a Cu layer may be delayed, thereby causing defects such as voids, etc., and ultimately causing degradation or failure of a device.

Figure 7:
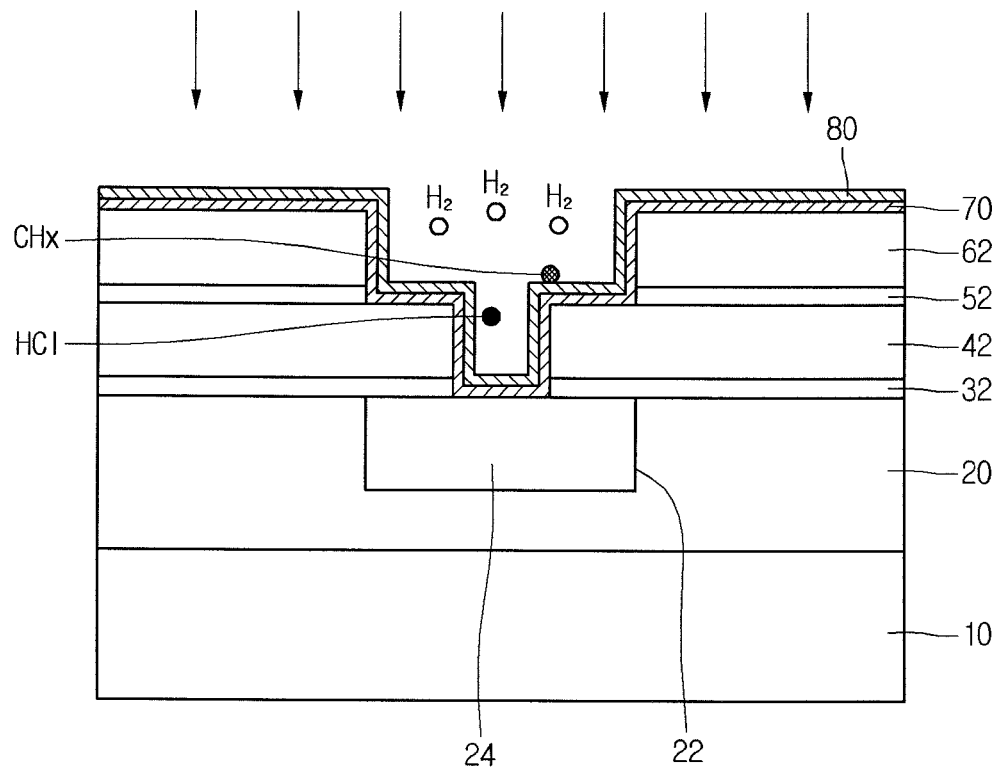

To remove the Cl and C ions, as shown in example FIG. 7, an $H_2$ thermal process or an $H_2$ plasma process may be performed. During an $H_2$ thermal or plasma process, the Cl and C components remaining over the barrier metal 70 are combined with $H_2$ (hydrogen) to form HCl (hydrogen chloride) and $CH_x$ (hydrocarbon), and thus may be removed.

The $H_2$ thermal process may use an $H_2$ gas flow of about 50 to 2000 sccm and may be performed at a temperature of approximately 100° C. to 450° C. in a furnace or a vacuum chamber. When using the vacuum chamber, the process may be performed at a pressure of approximately $1 \times 10^{-5}$ Torr to 5 mTorr. The $H_2$ plasma process may be performed at a frequency of, for example, 300 kHz to 13.56 MHz with power of approximately 100 to 600 W.

Figure 8:
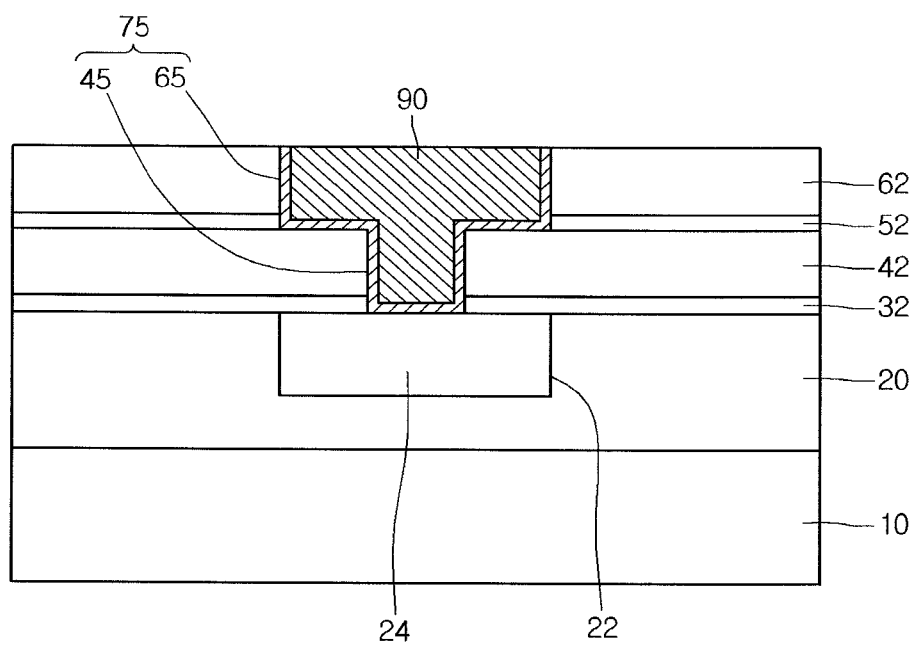

As shown in example FIG. 8, copper is buried in the damascene pattern 75 to form a copper wire 90. After performing the ECP process over the semiconductor substrate 10 formed with the damascene pattern 75, a planarization pattern is performed, making it possible to form the copper wire 90.

As described above, the Cl ions and the C ions generated when forming the cooper seed layer 80 may be removed, making it possible to prevent corrosion of a metal wire. Generation of voids may be prevented when forming the metal wire. Therefore, a higher device integration can be realized, together with improvement in reliability and yield of the device.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method of manufacturing a semiconductor device, comprising:
   forming an interlayer dielectric film with a damascene pattern over a semiconductor substrate having a lower metal wire;
   forming a seed layer over the interlayer dielectric film including the damascene pattern;
   removing impurities generated during the formation of the seed layer through an annealing process using H2; and
   forming a copper wire by filling the damascene pattern.

2. The method of claim 1, wherein in removing impurities, the impurities generated when forming the seed layer react with H2.

3. The method of claim 1, wherein the annealing process is performed in a furnace.

4. The method of claim 1, wherein the annealing process is performed in a vacuum chamber.

5. The method of claim 4, wherein the annealing process is performed at a pressure of 1×10−5 Torr to 5 mTorr.

6. The method of claim 1, wherein before forming the seed layer, a barrier metal is formed over the interlayer dielectric film including the damascene pattern.

7. The method of claim 6, wherein the barrier metal is formed of Ta.

8. The method of claim 6, wherein the barrier metal is formed of TaN.

9. The method of claim 1, wherein forming a copper wire comprises forming a copper layer through an electro chemical plating (ECP) process.

10. The method of claim 9, wherein the copper wire is formed by performing a chemical-mechanical polishing process on the copper layer.

11. The method of claim 1, wherein the seed layer is formed using metal organic source through an ALD process.

12. The method of claim 1, wherein the seed layer is formed using metal organic source through a CVD process.

13. The method of claim 1, wherein the seed layer is formed at a thickness of approximately 100 to 1000 Å.

14. The method of claim 1, wherein the annealing process uses H2 at a flow rate of approximately 50 to 2000 sccm.

15. The method of claim 1, wherein the annealing process proceeds at a temperature of about 100 to 450° C.

16. The method of claim 1, wherein the forming an interlayer dielectric film with a damascene pattern over a semiconductor substrate having a lower metal wire comprises:
    forming a first dielectric film having a lower metal wire; and
    forming a first etch stop film, a second dielectric film, a second etch stop film and a third dielectric film over the first dielectric film having a lower metal wire.

17. The method of claim 16, wherein the forming an interlayer dielectric film with a damascene pattern over a semiconductor substrate having a lower metal wire comprises:
    forming a trench by performing a first etching process on the third dielectric film and the second etch stop film.

18. The method of claim 17, wherein the forming an interlayer dielectric film with a damascene pattern over a semiconductor substrate having a lower metal wire comprises:
    forming a via by performing a second etching process on the first dielectric film and the first etch stop film, thereby forming damascene pattern having the trench and the via.

19. The method of claim 18, wherein when performing the second etching process to form the via, the lower metal wire is exposed.

20. The method of claim 16, wherein the first etch stop film and second etch stop film are formed of SiN.

* * * * *